United States Patent [19]

Bindloss et al.

[11] Patent Number: 5,426,717
[45] Date of Patent: Jun. 20, 1995

[54] LINE-WIDTH INSENSITIVE SEGMENTED WAVE REFLECTORS HAVING SELECTED BRAGG REFLECTION CHARACTERISTICS

[75] Inventors: William Bindloss, Wilmington; Mark G. Roelofs, Hockessin, both of Del.

[73] Assignee: E. I. Du Pont de Nemours and Company, Wilmington, Del.

[21] Appl. No.: 201,911

[22] Filed: Feb. 25, 1994

[51] Int. Cl.$^6$ .............................................. G02B 6/10
[52] U.S. Cl. .................................. 385/129; 385/130; 359/575; 359/586; 359/589; 359/326; 359/332
[58] Field of Search ............... 385/122, 129, 130, 131, 385/132, 37; 359/566, 568, 569, 570, 575, 580, 586, 588, 589, 326, 332

[56] References Cited

U.S. PATENT DOCUMENTS

| | | | |
|---|---|---|---|
| 4,087,159 | 5/1978 | Ulrich | 385/129 |
| 4,231,838 | 11/1980 | Gier | 156/600 |
| 4,240,696 | 12/1980 | Tracy et al. | 359/359 |
| 4,305,778 | 12/1981 | Gier | 156/623 R |
| 4,740,265 | 4/1988 | Bierlein et al. | 156/624 |
| 4,766,954 | 8/1988 | Bierlein et al. | 156/624 |
| 5,028,107 | 7/1991 | Bierlein et al. | 350/96.12 |
| 5,157,754 | 10/1992 | Bierlein et al. | 385/122 |
| 5,243,676 | 9/1993 | Bierlein et al. | 385/122 |

OTHER PUBLICATIONS

Hunsperger, R. G., *Integrated Optics: Theory and Technology*, New York, Springer-Verlag, 1982, pp. 216–229, no month available.
Henry, C. H. et al, *J. Lightwave Technology*, 7(9), 1379–1385, Sep. 1989.
Adar, R. et al, *Apply. Phys. Lett.*, 60(15), 1779–1781, 13 Apr. 1992.
Mortin, P. A. et al, *Apply. Phys. Lett.*, 59(23), 2944–2946, 2 Dec. 1991.
Bierlein et al, *Appl. Phys. Lett.*, 56(18), 1725–1727, 30 Apr. 1990.
Armstrong, J. A. et al, *Phys. Rev.*, 127(6), 1918–1939, 15 Sep. 1962.
Webjörn, J. et al, *Journal of Lightwave Technology*, 7(10), 1597–1600, Oct. 1989.
Webjörn, J. et al, *IEEE Photonics Tech. Letters*, 1(10), 316–318, Oct. 1989.
Magel, G. A. et al, *Appl. Phys. Letters*, 56(2), 108–110, 8 Jan. 1990.
van der Poel et al, *Appl. Phys. Lett.*, 57(20), 2074–2076, 12 Nov. 1990.
Wieman, C. E. et al, *Rev. Sci. Instrum.*, 62(1), Jan. 1991.
Shinozaki, K. et al, *Appl. Phys. Lett.*, 59(5), 510–512, 29 Jul. 1991.

(List continued on next page.)

*Primary Examiner*—Frank Gonzalez

[57] ABSTRACT

A segmented article is disclosed which has selected Bragg reflection characteristics for a selected input wavelength. The article includes alternating sections of optical materials which are aligned and have refractive indexes different from adjacent sections to form at least one superperiod consisting of a plurality of segments such that each segment consists of a section of a first optical material and a section of a second optical material. At least one segment of the superperiod is different in optical path from another segment of the superperiod, and the interfaces between sections of the superperiod create backward travelling waves of complex amplitude at the selected input wavelength. The sequentially odd interfaces in the superperiod form a first set of interfaces and the sequentially even interfaces in the superperiod form a second set of interfaces. The article is characterized by (1) the sum for the superperiod sections of the product of the length of each section in the direction of alignment and the refractive index of the section being equal to about $N_z\lambda/2$ where $N_z$ is an integer and $\lambda$ is the wavelength of an input wave; and (2) the interfaces of the sequentially odd or even set of interfaces in the superperiod being spaced such that the modulus of the sum of the complex amplitudes created by that set is about zero or is less than 40 percent of the modulus of the sum of the complex amplitudes created by the other set. Devices are disclosed where the Bragg reflection from a Bragg reflector of this invention is used to stabilize a laser source.

11 Claims, 7 Drawing Sheets

OTHER PUBLICATIONS

Shinozaki, K. et al, *Appl. Phys. Lett.,* 58(18), 1934–1936, 6 May 1991.

Roelofs, M. G. et al, "KTP segmented waveguides as concurrent Bragg reflectors and second harmonic generators," Summaries of papers presented at the Advanced Solid–State Lasers Topical Meeting and the Compact Blue–Green Lasers Topical Meeting, Feb. 1–4, 1993, New Orleans, La.

Yao, Y. F. Y. et al, *J. Inorg. Nucl. Chem.,* 29, 2453–2457, 1967 (no month available).

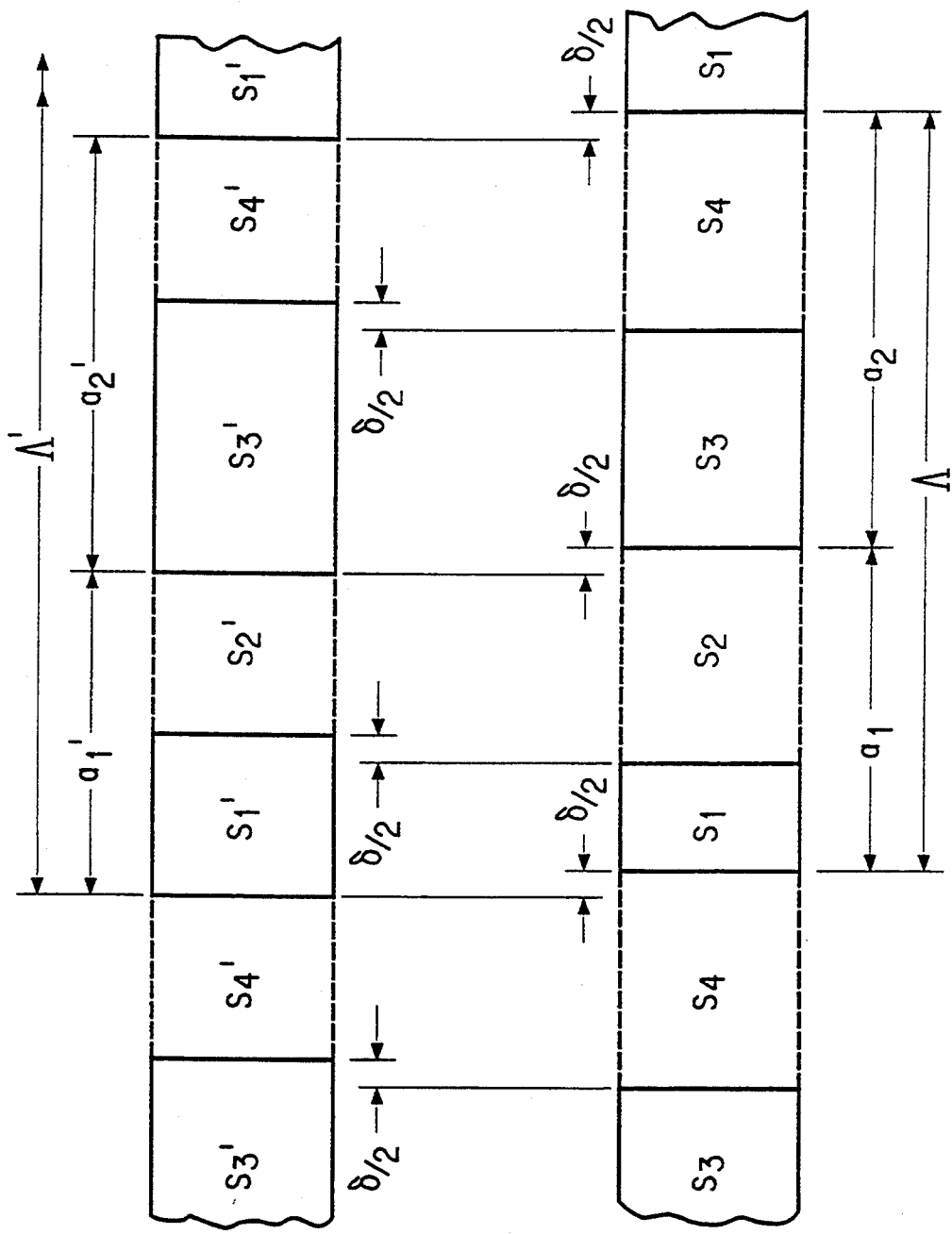

LINE-WIDTH INSENSITIVE SEGMENTED WAVE REFLECTORS HAVING SELECTED BRAGG REFLECTION CHARACTERISTICS

FIELD OF THE INVENTION

This invention relates to optical articles and more particularly to segmented optical articles having useful Bragg reflection characteristics.

BACKGROUND OF THE INVENTION

A challenge often encountered in the design of optical systems is the controlled diffraction and reflection of optical radiation of selected wavelengths. In the area of integrated optics, reflections are often produced by employing Bragg gratings. For example, in the area of solid state diode lasers, control of the wavelength of the laser is often effected by incorporating etched Bragg reflector gratings on the semiconductor laser substrate (Hunsperger, R. G. (1982), *Integrated Optics: Theory and Technology*, New York, Springer-Verlag).

Recently, techniques for fabrication of optical waveguides on a silicon substrate have been described. The waveguides may be formed by depositing or growing successive layers of $SiO_2$, $Si_3N_4$ and $SiO_2$ on top of a Si substrate, while the Bragg reflectors were made in the waveguides by defining a resist pattern with photolithography, then etching a grating through this pattern in to the top $SiO_2$ cladding layer (C. H. Henry et al., "Compound Bragg Reflection Filters Made by Spatial Frequency Doubling Lithography," *J. Lightwave Technology*, 7 (9):1379-1385 (1989)). Bragg reflectors are useful in wavelength division demultiplexing of optical communications (R. Adar, et al., "Polarization Independent Narrow Band Bragg Reflection Gratings made with Silica-on-Silicon Waveguides," *Apply. Phys. Lett.*, 60 (15):1779-1781 (1992)), and as external grating used to force diode lasers to emit light in a very narrow band of wavelengths (P. A. Morton et al., "Hybrid Solution Pulse Source using a Silica Waveguide External Cavity and Bragg Reflector," *Appl. Phys. Lett.*, 59(23):2944-2946 (1991)).

Recently, a particularly useful wavelength conversion technique (denoted "balanced phase matching") has been developed, (See Bierlein et al., Appl. Phys. Lett. 56 (18) pp. 1725-1727 (1990) and U.S. Pat. No. 5,028,107), which involves directing the incident optical waves for wavelength conversion through a series of aligned sections of optical materials for wavelength conversion, said sections being selected such that the sum for the series of sections of the product of the length of each section in the direction of alignment and the $\Delta k$, i.e., change in the propagation constant, for that section is equal to about zero, and such that the length of each section is less than its coherence length; wherein either at least one of said materials is optically nonlinear or a layer of nonlinear optical material is provided adjacent to said series during wavelength conversion, or both. This technique is based on the discovery that wavelength conversion can be accomplished by using a series of sections of optical materials wherein the differences in the refractive indices and the section lengths are balanced to control the effects of destructive interference through the series such that the optical waves are phase matched at the end of the series even though they are not phase matched in the individual sections.

Other techniques for wavelength conversion, which are known as "quasi" phase matching techniques, and include periodic domain reversals or internal reflection have also been described (see J. A. Armstrong et al., "Interactions between Light Waves in a Nonlinear Dielectric", Phys. Rev., 127, 1918 (1962)) . Quasi phase matching in optical waveguides has been described using periodically modulated $LiNbO_3$ which achieve phase matching by periodically reversing the sign of the nonlinear optical coefficient with a period length such that the product of $\Delta k$ and period length of the waveguide is about equal to $2N\pi$, where N is an odd integer. Periodically domain-inverted channel waveguides utilizing $LiNbO_3$ are described by J. Webjorn, F. Laurell, and G. Arvidsson in Journal of Lightwave Technology, Vol. 7, No. 10, 1597-1600 (October 1989) and IEEE Photonics Technology Letters, Vol. 1, No. 10, 316-318 (October 1989). Waveguide fabrication is described using titanium to achieve the periodic domain inversion, or using a periodic pattern of silicon oxide on the positive c-face of $LiNbO_3$ in combination with heat treatment and subsequent proton exchange. G. A. Magel, M. M. Fejer and R. L. Byer, Appl. Phys. Let. 56, 108-110 (1990) disclose $LiNbO_3$ crystals with periodically alternating ferroelectric domains produced using laser-heated pedestal growth. These structures generated light at wavelengths as short as 407 nm and were relatively resistant to photorefractive damage for structures of this type. However, these periodically modulated waveguides are considered difficult to fabricate and have optical damage thresholds which are too low for many applications.

Recently, a particularly useful wavelength conversion technique based on "quasi" phase matching has been developed, (see U.S. Pat. No. 5,157,754 and van der Poel et al., Appl. Phys. Lett. 57 (20), pp. 2074-2076 (1990)), which involves directing the incident optical waves for wavelength conversion through a single crystal containing a series of aligned sections of optical materials for wavelength conversion selected from (a) materials having the formula $K_{1-x}Rb_xTiOMO_4$ where x is from 0 to 1 and M is selected from P and As and (b) materials of said formula wherein the cations of said formula have been partially replaced by at least one of $Rb^+$, $Tl^+$ and $Cs^+$, and at least one of $Ba^{++}$, $Sr^{++}$ and $Ca^{++}$ with the provisos that at least one section is of optical materials selected from (b) and that for optical materials selected from (b) wherein x is greater than 0.8, the cat ions of said formula are partially replaced by at least one of $Tl^+$ and $Cs^+$ and at least one of $Ba^{++}$, $Sr^{++}$, and $Ca^{++}$, said sections being selected such that the sum for the series of sections of the product of the length of each section in the direction of alignment and the $\Delta k$ for that section is equal to about $2\pi N$ where N is an integer other than zero, and such that the nonlinear optical coefficient of at least one section is changed relative to the nonlinear optical coefficient of at least one adjacent section. This technique makes use of the well known advantages of $KTiOMO_4$-type materials (where M is P or As), such as high nonlinearity and resistance to damage, as well as quasi phase matching, and provides for changing the sign and/or magnitude of the nonlinear optical coefficient (i.e., "d") to achieve wavelength conversion.

It is well known in the art that incident light for second harmonic generation may be provided using laser diodes. It is also well known that laser diode performance can be affected by optical feedback. See C. E. Wieman et al., "Using Diode Lasers for Atomic Physics", Rev. Sci. Instrum. 62(1) (1991). Optical feedback of some wavelengths can have an undesirable effect on the laser output wavelength, thereby significantly impeding operation of apparatus relying on effective laser operation. On the other hand, optical feedback of appropriate wavelengths can be used to control the center frequency of diode lasers, thereby stabilizing operation of such apparatus. In any case, substantial surface reflection back to a diode laser is generally considered undesirable. U.S. Pat. No. 5,243,676 describes a segmented waveguide suitable for wavelength conversion at a selected wavelength comprising alternating sections of optical materials which are aligned and have refractive indices different from adjacent sections, characterized by a periodic structure along the waveguide which provides a Bragg reflection for said selected wavelength which has a wavelength essentially equal to the wavelength of the input wave. The periodic structure contains at least one superperiod consisting of a plurality of segments (each segment consisting of one section each of two optical materials) wherein at least one segment of the superperiod is different in optical path length from another segment thereof and wherein the sum for the superperiod sections of the product of the length of each section in the direction of alignment and the refractive index of the section is equal to about $N_z\lambda/2$ where $N_z$ is an integer and $\lambda$ is the wavelength of the input wave used for wavelength conversion.

Bragg reflectors integrated with proton-exchanged waveguides in $LiNBO_3$ have also been described. These have been used as selective feedback elements for altering the lasing characteristics of a pump diode laser for frequency doubling (K. Shinozaki et al., "Self-quasi-phase-matched Second-harmonic Generation in the Proton-exchanged $LiNbO_3$ Optical Waveguide with Periodically Domain-inverted Regions," *Appl. Phys. Lett.*, 59(5):510–512 (1991)), and to form an external resonant cavity containing a frequency-doubling waveguide (K. Shinozaki et al., "Second-harmonic Generation Device with Integrated Periodically Domain-inverted Regions and Distributed Bragg Reflector in a $LiNbO_3$ Channel Waveguide," *Appl. Phys. Lett.*, 58(18):1934–1936 (1991)).

One of the major difficulties in producing Bragg reflectors photolithographically having the dimensions required by the art structures described above lies in the inexact nature of the photolightgraphic process per se. The Bragg reflectors actually produced may have dimensions different from those that were actually desired due to accidental over exposure or under exposure. In specific terms, consider typical photolithography utilizing a dark-field mask with rectangular openings, a positive-working photoresist on top of a metal layer on top of the substrate, whereby the metal layer is etched through the rectangular openings in the photoresist. In this example, an under exposure through the photomask tends to decrease the size of the openings in the metal mask, whereas over exposure tends to increase the size of the openings. In either case the dimensions of the sections required in the Bragg reflector could be adversely affected.

SUMMARY OF THE INVENTION

The present invention involves providing Bragg reflection with relatively low sensitivity to the inexact nature of the photolithographic process. This invention provides a segmented article (e.g., a segmented waveguide) which is suitable for use with an input wave of selected wavelength, and has selected Bragg reflection characteristics for said input wavelength. The optical articles of this invention comprise alternating sections of optical materials which are aligned and have refractive indexes different from adjacent sections to form at least one superperiod consisting of a plurality of segments (each segment consisting of a section of a first optical material and a section of a second optical material), wherein at least one segment of the superperiod is different in optical path from another segment thereof, and wherein the interfaces between sections of the superperiod create backward travelling waves of complex amplitude at said input wavelength, with the first, third, and any other sequentially odd interfaces in the superperiod forming a first set of superperiod interfaces and the second, fourth, and any other sequentially even interfaces in the superperiod forming a second set of superperiod interfaces. The optical articles of this invention are characterized by (1) the sum for the superperiod sections of the product of the length of each section in the direction of alignment and the refractive index of the section being equal to about $N_z\lambda/2$ where $N_z$ is an integer larger than 1 and $\lambda$ is the wavelength of an input wave; and (2) the interfaces of one of said two sets of interfaces in the superperiod being spaced such that the modulus of the sum of the complex amplitudes created by that set at said input wavelength is either about zero or is less than 40 percent of the modulus of the sum of the complex amplitudes created by the other set. The two conditions (1) and (2) together provide desirable Bragg characteristics which are relatively insensitive to variation in the lithographic linewidth.

Segmented articles in accordance with this invention may be used in a device together with a laser source such that the Bragg reflection from the segmented article is used to stabilize the laser source.

BRIEF DESCRIPTION OF THE DRAWINGS

FIG. 2 is a schematic drawing of one superperiod having two segments configured in accordance with this invention.

DETAILED DESCRIPTION OF THE INVENTION

Figure 1:
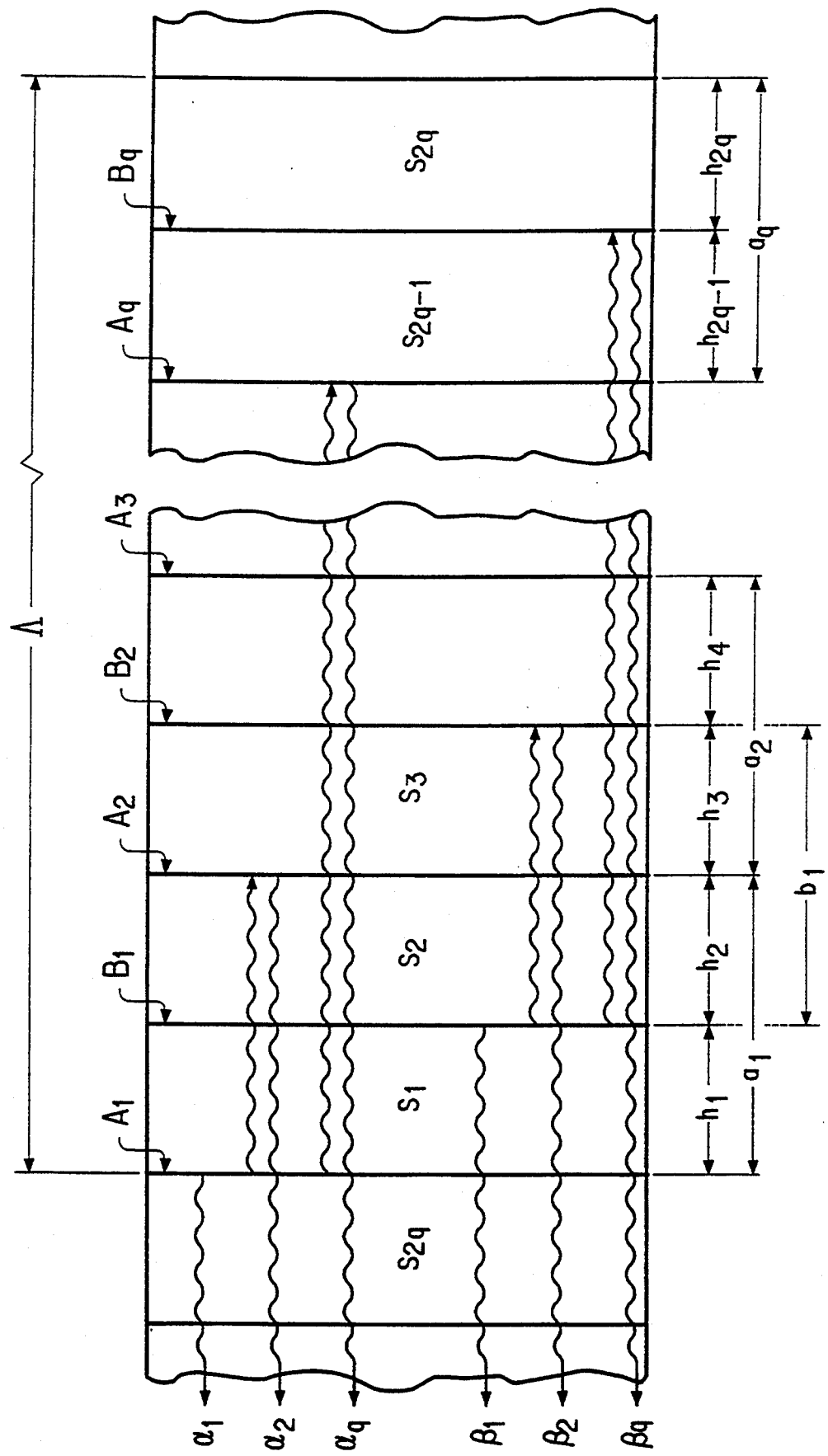
FIG. 1 is a schematic drawing of a waveguide in accordance with this invention.

This invention involves segmented articles having selected Bragg reflection characteristics which are relatively insensitive to lithographic linewidth variations. Included are bulk Bragg reflectors, and waveguide Bragg reflectors. Typically, the Bragg reflector is used to stabilize a laser source, or to provide for resonant field enhancement within a cavity, or to reflect radiation at a particular desired wavelength toward a detector.

This invention includes embodiments where the Bragg reflectors are advantageously used in wavelength conversion systems. These Bragg reflectors may be, for example, designed as separate portions of a device used for wavelength conversion, or integrally designed to provide a segmented pattern which simultaneously provides the desired Bragg reflection and wavelength conversion. Of particular note are segmented waveguides suitable for at least partially converting optical waves having one wavelength, into optical waves of a different wavelength. In general, during wavelength conversion the sum of the frequencies of the incident waves and the sum of the frequencies of the generated waves is equal. Accordingly, for wavelength conversion systems where waves of frequency $\omega_1$ and wavelength $\lambda_1$ are used along with waves of frequency $\omega_2$ and wavelength $\lambda_2$ to generate waves of frequency $\omega_3$ and wavelength $\lambda_3$, $\omega_3$ is equal to the sum of $\omega_1$ and $\omega_2$; and for wavelength conversion systems where waves of frequency $\omega_4$ and wavelength $\lambda_4$ are used to generate waves of frequency $\omega_5$ and wavelength $\lambda_5$ along with waves of frequency $\omega_6$ and wavelength $\lambda_6$, $\omega_4$ is equal to the sum of $\omega_5$ and $\omega_6$.

In accordance with this invention, a line-width insensitive segmented article which is suitable for use as a waveguide for wavelength conversion at a selected wavelength and comprises alternating sections of materials which are aligned and have refractive indexes different from adjacent sections (e.g., alternating sections of crystalline substrate having the formula $K_{1-x}Rb_xTiOMO_4$ where x is from 0 to 1 and M is P or As and sections of substrate material in which cations of said substrate have been partially replaced), is characterized by having a periodic structure along the waveguide which provides a Bragg reflection for said selected wavelength which has a wavelength essentially equal to the wavelength of the input wave used for wavelength conversion.

The segmented articles of this invention may be represented as having at least one superperiod wherein the number of segments per superperiod, q, is 2 or greater, and the minimum order of the Bragg reflection is 2 and wherein said superperiod has 2q sections of optical materials, or q segments (i.e., the pair of adjacent sections of optical materials $s_1$ and $s_2$ from the first segment, the pair of adjacent sections $s_3$ and $s_4$ form the second segment and the pair of adjacent sections $s_{2q-1}$ and $s_{2q}$ from the qth segment) each section being characterized by corresponding lengths, $h_1$, $h_2$, ... $h_{2q}$, wherein the period, $\Lambda$, of the superperiod is defined by $\Lambda = \Sigma h_i$, wherein i is an integer from 1 to 2q (see FIG. 1). Either the first or second section of each segment in the superperiod, say the odd sections (i.e., $s_1$, $s_3$, ... $s_{2q-1}$) has a greater refractive index than the other section of the segment, say even sections (i.e., $s_2$, $s_4$, ... $s_{2q}$). The sections are aligned such that incident beams of optical waves enter the article and propagate, they encounter the sections in the order $s_1$, then $s_2$, then $s_3$, etc. The set $A_1$, $A_2$, ... $A_q$ denotes the interfaces between the pairs of sections $(s_{2q}, s_1)$, $(s_2, s_3)$, ... $(s_{2q-2}, s_{2q-1})$. The set $B_1$, $B_2$, ... $B_q$, denotes the interfaces $(s_1, s_2)$, $(s_3, s_4)$, ... $(s_{2q-1}, s_{2q})$. Thus, the A interfaces are those where the incident optical beams traverse from a section of low to a section of high refractive index, while the set of B interfaces are those where the incident optical beams traverse from high to low index. The distance between the interfaces $A_i$ and $A_{i+1}$ is denoted $a_i$ (where i is from 1 to q-1). The distance between the interfaces $B_i$ and $B_{i+1}$ is denoted $b_i$. For a given incident beam, each of the interfaces $A_i$ or $B_i$ creates a backward traveling wave of complex amplitude $\alpha_i$ or $\beta_i$, respectively. In accordance with this invention, relative insensitivity to lithographic line width variations is obtained by (a) choosing a set $b_i$ such that the modulus of $\Sigma \beta_i$ is 0, or as close as practical to zero (given the resolution of the lithographic process) and/or a set $a_i$, such that the modulus of $\Sigma \alpha_i$ is 0, or as close as practical to zero; or (b) choosing a set $a_i$ and a set $b_i$ such that the modulus of $\Sigma \alpha_i$ is less than 40 percent of the modulus of $\Sigma \beta_i$ or the modulus of $\Sigma \beta_i$ is less than 40 percent of the modulus of $\Sigma \alpha_i$.

The superperiod structure may be employed using $\Sigma \beta_i$ modulus minimization steps as follows. Let $n_m$ be the refractive index which characterizes the propagation of the mode in the waveguide. The propagation constant is $k = 2\pi n_m/\lambda$, where $\lambda$ is the vacuum wavelength. Then $\Sigma \beta_i$ is proportional to $$\sum_0^{q-1} e^{i2kx_i}$$

where $x_0$ is 0, $x_1 = b_1$, $x_2 = b_1 + b_2$, and $x_i$ is $$\sum_{j=0}^{i} b_j.$$

Reference is made to FIG. 1 where the distance $2x_i$ may be illustrated as the distance from the boundary $B_1$ to $B_i$ and back.

Similarly, $\Sigma \alpha_i$ may be related to an $x_i$, where $x_i$ is $$\sum_{j=0}^{i} a_j.$$

The sum $\Sigma \alpha_i$ and $\Sigma \beta_i$ as defined here are independent of the relative position of the A and B sets of boundaries. The set of distances $b_j$ are chosen to minimize the modulus of $\Sigma \beta_i$. The set $a_j$ are then chosen to give the desired amplitude of the Bragg reflection. In some circumstances it may be desirable to eliminate the Bragg reflection entirely, and in these cases the set of distances $a_j$ are also chosen so as to minimize the modulus of $\Sigma \alpha_i$. In other cases the modulus of $\Sigma \alpha_i$ will be significant and in accordance with this invention the modulus of $\Sigma \beta_i$ will be less than 40 percent thereof; or $\Sigma \beta_i$ will be significant and in accordance with this invention the modulus of $\Sigma \alpha_i$ will be less than 40 percent thereof.

The final design step is to set the relative positions of the A and B boundaries so that the waveguide has no vanishing sections, and so that the mode index comes out to the value assumed at the start. Typically, it will be desirable to provide at least three superperiods which are spaced periodically along the optical path.

This invention is particularly useful in Bragg reflectors in which the control over the segment lengths $a_i$ and $b_i$ is adequate, but in which control over the relative lengths of the odd (high index) sections (e.g., $h_1$, $h_3$ and $h_{2q-1}$) and even (low index) sections (e.g., $h_2$, $h_4$ and $h_{2q}$) is not. Referring to FIG. 1, the spacings of the B boundaries (i.e., $B_1$, $B_2$ ... $B_q$) relative to the A boundaries, and the B boundaries relative to other B boundaries (i.e., the $a_i$ and $b_i$) can be as designed, but the relative positions of the A set and the B set vary systematically. Such systematic boundary shifts can result from inadequacies of the lithographic process and will in general cause variations in the Bragg intensity as the complex amplitude from the A interfaces goes in and out of phase with the complex amplitude from the B interfaces. By setting the modulus of $\Sigma\beta_i$ at about zero (or by setting the modulus of $\Sigma\beta_i$ less than 40 percent of the modulus of $\Sigma\alpha_i$) or alternatively by setting the modulus of $\Sigma\alpha_i$ at about zero (or by setting the modulus $\Sigma\alpha_i$ less than 40 percent of the modulus of $\Sigma\beta_i$) in accordance with this invention the sensitivity to these boundary shifts is substantially reduced or eliminated.

In other words this invention is useful when the grating pitch is controlled to higher accuracy than is the line width. For example, one of the difficulties in lithographically-defined Bragg diffractors is that the refractive-index-altered structures which are actually produced may have line widths altered from the design. The lithography process, for example, can be a step where an $e^-$-beam writes a pattern in a resist material, which is then developed, and possibly an additional etching process occurs to make a photomask; or, for example, the lithography process can be one in which an existing pattern in a photomask is transferred to a substrate. For example, in FIG. 2 is sketched one superperiod of two segments, embedded in a periodic array of the same superperiods. The top part of FIG. 2 shows the sections as designed, while the bottom part of FIG. 2 shows the device as might be actually produced by an imperfection (e.g., underexposure) in the lithography process. The odd-numbered sections $s_1$ and $s_3$ (higher refractive index), have been reduced in line width by an amount $\delta$ from the corresponding design sections $s_2'$ and $s_3'$ while the even numbered sections $s_2$ and $s_4$ have all been increased by an amount $\delta$ from the corresponding design sections $s_2'$ and $s_4'$. Such variations in the line width generally result in undesirable variations in the Bragg intensity. In first approximation, the variation in the lithographic line width leaves the segment lengths $a_i$ and $b_i$ unaltered from the corresponding segment design lengths $a_i'$ and $b_i'$ and the superperiod $\Lambda$, unaltered from the design superperiod $\zeta'$. The distances $a_i$ and $b_i$ are invariant (to first approximation) during waveguide fabrication; the particular set of section lengths $h_i$ is determined by choosing an offset with which to place the set of B interfaces relative to the set of A interfaces. Furthermore, this offset is inherently variable due to variations in the lithographic step(s) used in the fabrication of the reflector.

Figure 3A:
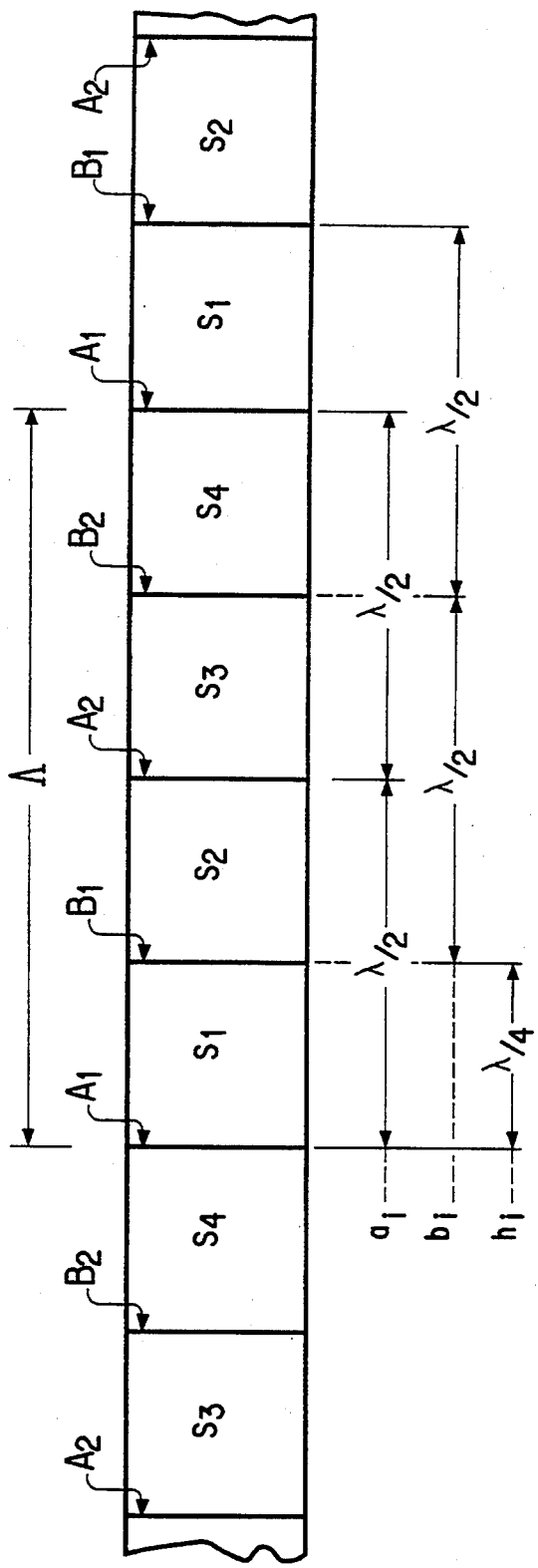
FIG. 3a is a periodic array of segments.
Figure 3B:
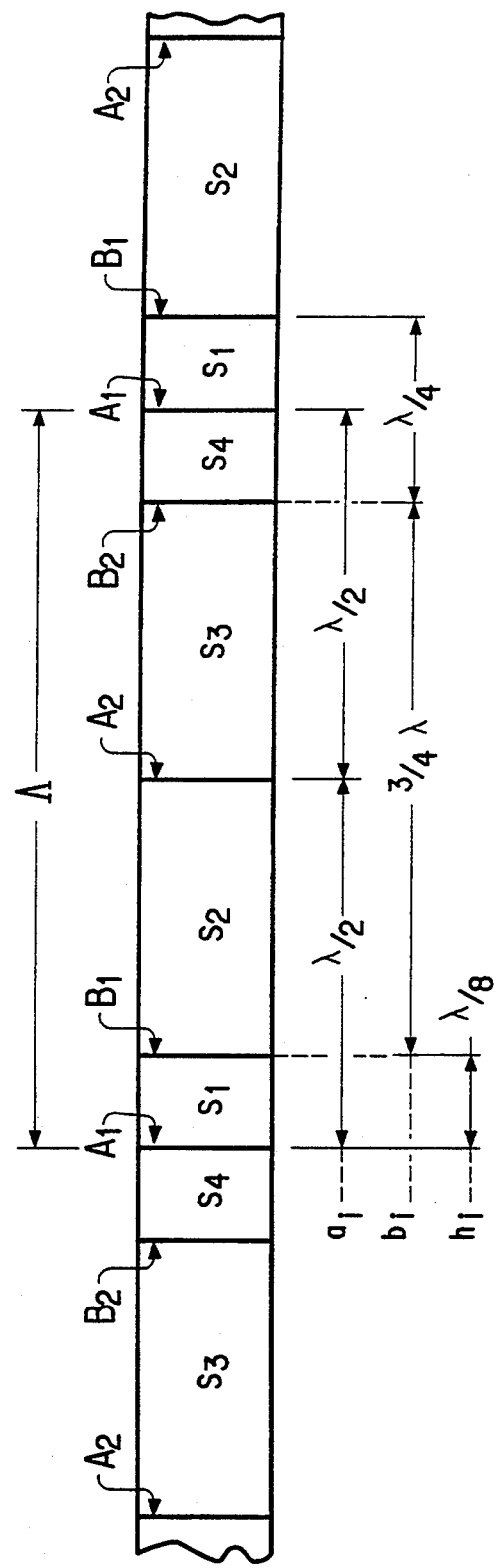
FIG. 3b is a periodic array of segments in accordance with this invent ion.
Figure 4:
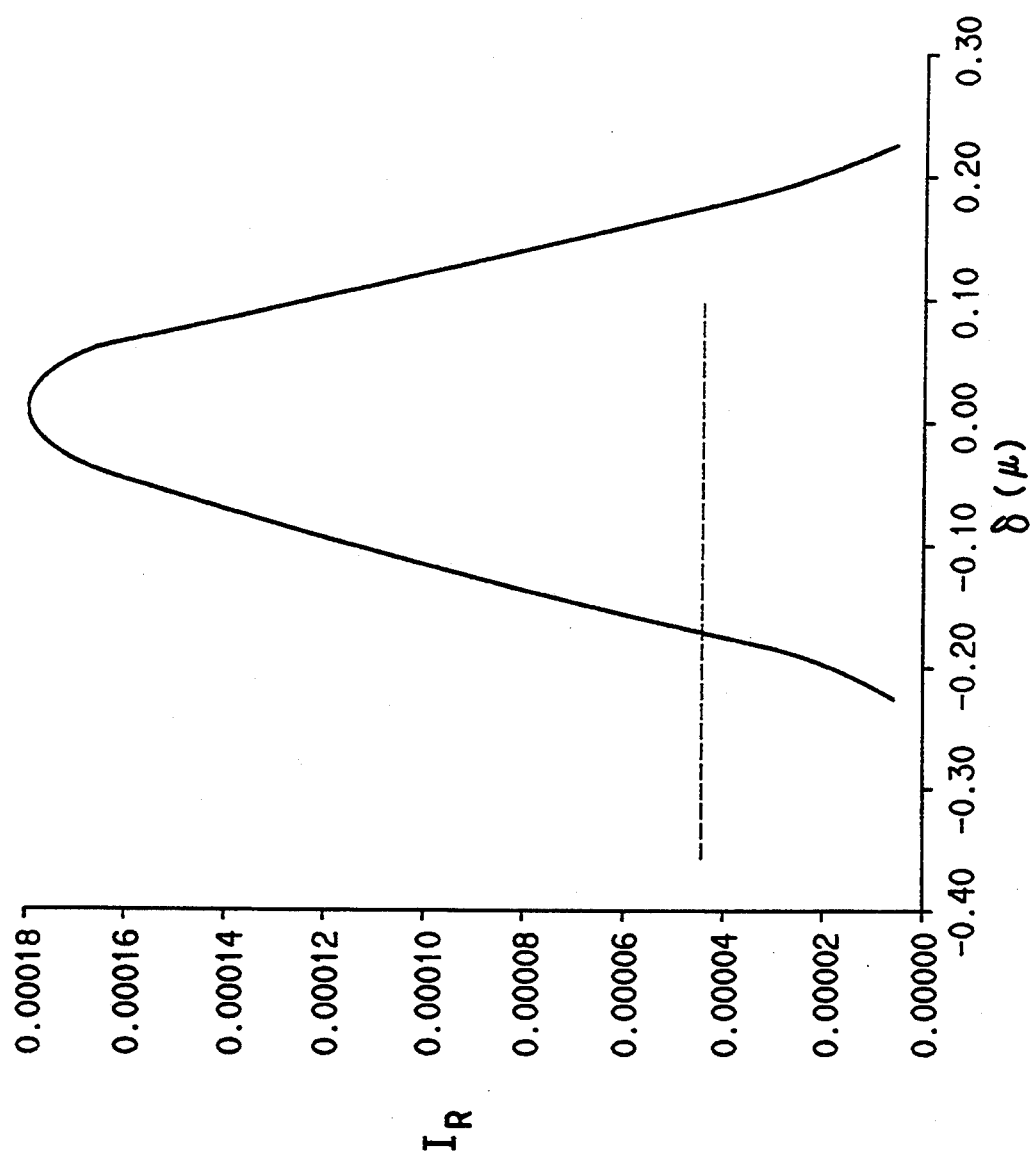
FIG. 4 is a graph of the intensity of reflectivity ($I_R$) versus the increase $\delta$ in $h_2$ and $h_4$.

This invention is restricted to superperiods where the number of segments per superperiod is 2 or greater, and the minimum order of the Bragg reflection is 2. Thus the simplest example is as follows: Referring to the periodic array illustrated in FIG. 3a, all the lengths $a_i$ and $b_i$ are made equal to $\lambda/2$, where $\lambda$ is the wavelength of the incident beam in the material. This insures that the reflectivity of both the set A and set B interfaces is maximum. The odd sections $s_1$ and $s_3$ have a higher refractive index than the even sections $s_2$ and $s_4$. The A and B interfaces are positioned relative to each other such that all the h's are quarter wave, $\lambda/4$. This insures that reflection from the A interfaces has the same phase as the reflection from the B interfaces (i.e., that the A and B reflectivities will interfere constructively). The as-designed reflector has maximum reflectivity for Bragg order 2 of the 2-segment superperiod. (Due to the high symmetry of the reflector in FIG. 3a, Bragg order 2 of the 2-segment superperiod occurs at the same wavelength as Bragg order 1 of a 1-segment superperiod.) When the set B interfaces is moved by a distance $\delta$ relative to the set A interfaces (either to the left or right), the reflectivity decreases as shown by the solid line in FIG. 4. In the practice of this invention, we wish to make the reflectivity of the B interfaces zero. In this case, this is achieved by altering positions of the B interfaces such that $b_1 = 3\lambda/4$ and $b_2 = \lambda 4$, as shown in FIG. 3b. This minimizes $\Sigma\beta_i$. For the second order Bragg reflection from the grating of FIG. 3b, if we make a movement $\delta$ of the set B interfaces relative to the set A interfaces, the reflectivity is relatively constant, as shown by the dashed line in FIG. 4. The reason the reflectivity is relatively constant under line width variations is that, because the modulus of $\Sigma\beta_i$ is about zero, its phase relative to reflections from the A interfaces is essentially irrelevant in determining the overall reflectivity. Note that the constant reflectivity of the dashed line of FIG. 4 is only one quarter of the maximum intensity reflectivity of the solid line in FIG. 4 (i.e., the reflected field amplitude is only one half). In accordance with this invention the reflected amplitude per path length is reduced from the maximum possible, in order to achieve a reflectivity which is more independent of fabrication errors. In many applications, one does not seek the absolute maximum reflectivity, and this is an asset rather than liability. Lower reflected amplitude per mm of path length allows one to use longer path lengths and achieve narrower reflectance band width. Also, there may be some other constraint, such as minimum path length needed for SHG, which will dictate that the maximum reflected amplitude per mm is not used.

If a weak Bragg reflection is desired, both $\Sigma\alpha_i$ and $\Sigma\beta_i$ can independently be made zero (or as close to zero as possible). The Bragg reflection is then minimized in such a way as to insure that it will remain minimum under line width variations. Note that there are in general many different ways to design the reflector so that $\Sigma(\alpha_i + \beta_i)$ is zero, but only the subset described above gives the desired manufacturing tolerance.

More generally, a superperiod may consist of a plurality of p aligned adjacent sections of optical materials $m_1, m_2, \ldots m_p$. The complex amplitude of a Bragg reflection will be the sum of the complex amplitudes of all the individual boundaries, some of which will have increasing refractive index and others of which will have a decreasing refractive index. The overall sum can in general be broken down into subsets which are individually summed and then added together. If the manufacturing process results in the uncontrolled but coherent (all in unison) movement of one set of boundaries relative to others, then the articles of this invention will be designed such that the separations between the boundaries of that set produce a sum of reflected field amplitudes for that set of essentially zero.

The description above is most accurate in the limit of a small change in index $\Delta n$ between the low and high index sections. As $\Delta n$ becomes large, then the amplitudes of $\Sigma\alpha_i$ and $\Sigma\beta_i$, not just the relative phases of the reflections, are changed by variations in line width. However, though approximate, the method described here is still useful in large $\Delta n$ cases.

A suitable periodic structure may be provided in accordance with this invention for wavelength conversion. For example, one way to space the alternating sections of materials (e.g., alternating sections of crystalline substrate having the formula $K_{1-x}Rb_xTiOMO_4$ where x is from 0 to 1 and M is P or As and sections of substrate material in which cations of said substrate have been partially replaced) precisely at a period selected such that a Bragg reflection will essentially correspond in wavelength to the wavelength of the input wave for wavelength conversion. Accordingly, a process for wavelength conversion is provided in accordance with this invention which comprises the step of directing the incident optical waves for wavelength conversion through a series of aligned sections of optical materials for wavelength conversion, said sections being selected as indicated above such that the desired Bragg reflection is provided.

For waveguides, the total number of sections provided can depend on such factors as the optical materials used and the waveguide length. A range of about 400 to 4000 sections can be provided in a typical 5.0 mm long waveguide. Longer waveguides can have up to 10,000 sections, or even more. However, articles using only about twenty sections are also considered to be within the scope of this invention.

Both linear and nonlinear materials can be used in accordance with this invention. In certain embodiments at least one section of each segment has a non-zero nonlinear optical coefficient. If the article is a bulk reflector rather than a waveguide, then as few as four sections may be used. Devices comprising a Bragg reflector of this invention and a laser source may be designed such that the Bragg reflection from the Bragg reflector is used to stabilize the laser source.

Preferred optical materials for the optical articles of this invention for use in a wavelength conversion system include crystalline materials selected from single crystal material having the formula $K_{1-x}Rb_xTiOMO_4$, where x is from 0 to 1 and M is selected from the group consisting of P and As and single crystal materials of said formula where the cations of said formula are partially replaced by at least one of $Rb^+$, $Tl^+$ and $Cs^+$. For practical reasons, when using materials of said formula wherein the cations have been partially replaced and x is about 0.8 or more, the replacement cations preferably include $Cs^+$, $Tl^+$ or both $Cs^+$ and $Tl^+$. As indicated by U.S. Pat. No. 4,766,954 the use of divalent ions (e.g., $Ca^{++}$, $Sr^{++}$ and $Ba^{++}$) with , $Rb^+$, $Cs^+$ and/or $Tl^+$ ions can provide a wide degree of control of refractive index. The divatent ions, as well as $Rb^+$, $Cs^+$ and/or $Tl^+$ ions can exchange with the monovalent cations of substrate material (e.g., the $K^+$ ions of a $KTiOPO_4$ substrate). Examples of articles using the materials of this invention include an article having a single crystal of $KTiOPO_4$ which has been modified (e.g., by cation exchange) to provide a waveguide of sequential sections of $KTiOPO_4$ and sections of $K_{1-x}Rb_xTiOMO_4$ where x is not zero, and an article having a single crystal of $KTiOPO_4$ which has been modified to provide a waveguide of sequential sections of $KTiOPO_4$ and sections of $KTiOPO_4$ where the cat ions are partially replaced by $Ba^{++}$ and at least one of $Rb^+$ and $Tl^+$.

Preferred substrate materials are single crystal materials having the formula $KTiOMO_4$ where M is P or As. Single crystal material of the formula $KTiOMO_4$ which is considered useful as a substrate material in the practice of this invention can be prepared by any method which provides a crystal of optical quality. Common methods of crystal growth include hydrothermal processes and flux processes. U.S. Pat. No. 4,305,778 discloses a suitable hydrothermal process for growing single crystals of $KTiOMO_4$ which involves using as a mineralizing solution an aqueous solution of a glass defined by specified portions of the ternary diagrams for the selected $K_2O/M_2O_5/(TiO_2)_2$ system. U.S. Pat. No. 4,231,838 discloses a suitable flux growth process for growing single crystals of $KTiOMO_4$ comprising heating selected starting ingredients, chosen to be within the region of a ternary phase diagram in which the desired crystal product is the only stable solid phase, and then controllably cooling to crystallize the desired product. When utilizing single crystals of $KTiOMO_4$ to prepare optical articles in accordance with the teachings of this invention, one can use hydrothermally grown or flux grown crystals.

The crystalline optical materials used for quasi-phase matching are preferably single crystal materials having the formula $K_{1-x}Rb_xTiOMO_4$ where x is from 0 to 1 and M is selected from the group consisting of P and As and single crystal material of said formula wherein the cations of said formula having been partially replaced by at least one of $Rb^+$, $Tl^+$ and $Cs^+$, and at least one of $Ba^{++}$, $Sr^{++}$ and $Ca^{++}$. At least one of the aligned sections in the series should be of an optical material of said formula wherein the cations have been partially replaced by at least one of $Ba^{++}$, $Sr^{++}$ and $Ca^{++}$. For practical reasons, when using material of said formula wherein the cations have been partially replaced and x is about 0.80 or more, the monovalent replacement cations should include $Cs^+$, $Tl^+$ or both $Cs^+$ and . The $Tl^+$ sections are preferably aligned on the z surface of the crystal.

The invention may be employed for waveguide structures, bulk applications and under certain circumstances, for mixed guided and unguided wave systems. In mixed systems, each unguided length in the wave propagation direction should be less than the defocusing length of the wave in the material to minimize radiation losses between the guide sections.

Bulk interference reflectors may be fabricated using lithographic techniques as follows. A one-dimensional ion exchange material, such as KTP, or a two-dimensional ion exchange material, such as sodium $\beta$-alumina, is selected. In sodium $\beta$-alumina, ion exchange occurs along the a and b crystallographic directions, but not along the c direction (Y.F.Y. Yao, and J. T. Kummer, "Ion Exchange Properties of and Rates of Ionic Diffusion in $\beta$-alumina," J. Inorg. Nucl. Chem., 29:2453–2475 (1967)). The (100) face of the $\beta$-alumina crystal is lithographically patterned with an ion-exchange mask containing stripes which run parallel to the b direction (FIG. 1, b vertical and c horizontal, but the sections become as wide as the dimension of the bulk crystal along the b direction). The other faces are covered to prevent ion exchange. Ion exchange with potassium in, for example, molten $KNO_3$, is carried out to exhaustion, creating planar layers of higher index material in which the planes are perpendicular to the c axis. The lack of ion exchange along the c direction insures that the interfaces between the exchanged and un-exchanged areas will be sharp. Light propagating along the c direction encounters a stack of dielectric layers, similar to what are known as dielectric mirrors and interference filters made by depositing layers on a substrate. This is an extension of the waveguide technology in KTP, where the width and depth of the guide have been increased until the optical wave is no longer tightly confined (guided), but is better described as propagating in a bulk structure.

Segmented articles in accordance with this invention may be used in a device together with a laser source such that the Bragg reflection from the segmented article is used to stabilize the laser source. The Bragg reflector of the devices may, in some instances, be a waveguide (e.g., a waveguide suitable for wavelength conversion). For example, the instant invention may be used to provide an optical waveguide device which is characterized by having a channel waveguide which is a segmented waveguide having a periodic structure along the waveguide which provides a Bragg reflection for an incoming optical wave at a selected wavelength which has a wavelength essentially equal to the wavelength of the input wave, and which has means to direct Bragg reflection to the laser source of the input wave, and means to couple an incoming optical wave into said channel waveguide. The waveguide may be angled at its input and output ends, thereby reducing surface reflection. The means to couple an incoming optical wave into the channel waveguide may comprise two lenses, a first lens positioned to substantially collimate the incoming optical wave and a second lens positioned to focus the collimated wave to the input end of the waveguide. Alternatively, the means to couple an incoming optical wave into the channel waveguide may comprise a butt coupling. Typically, the device will also comprise means to couple an outgoing optical wave out of said channel waveguide. The device may also comprise a solid state diode laser for producing optical waves, and optionally, temperature control means for maintaining the diode laser at a temperature suitable for producing said input optical waves. By similar means bulk interference reflectors of this invention may be used to direct a beam back into a laser source, or into a detector.

Figure 7:
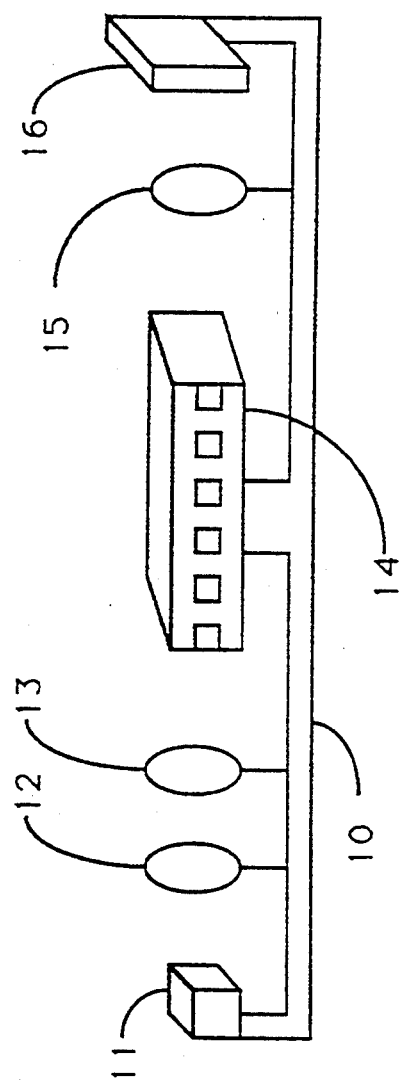
FIG. 7 is a schematic drawing of an apparatus for Bragg reflection and wavelength conversion in accordance with this invent ion.

Employment of the instant invention is illustrated by reference to the apparatus (10) shown in FIG. 7 wherein optical waves emitted by laser (11) at one wavelength may be used to generate waves at another wavelength. Lens (12) is used to focus the optical waves emitted by laser (11) through a second lens (13) to focus the optical waves on waveguide (14). Wavelength conversion occurs within waveguide (14). A third lens (15) collimates the optical waves emerging from the waveguide. A filter (16) is provided in the arrangement shown to filter out any remaining optical waves which have the wavelength of the emitted waves, while allowing the optical waves of the desired wavelength which were generated within the waveguide (14) to pass through. Thus, for example, if laser (11) is a semiconductor diode laser emitting light at wavelength of about 0.85 $\mu$m, and the waveguide (14) is constructed for second harmonic generation using such incident light and to provide a Bragg reflectance at a wavelength of about 0.85 $\mu$m in accordance with this invention, the diode laser locks onto the Bragg reflectance at about 0.85 $\mu$m. The diode laser may be temperature tunable to allow for adjustments of its output wavelength within a limited range (e.g., about 1.5 Å), and because of the interaction with Bragg reflectance, the laser does not jump to random wavelengths outside of the temperature adjustment range. Filter (16) is adapted to allow optical waves of wavelength 0.425 $\mu$m to pass through while any optical waves of wavelength 0.85 $\mu$m are filtered from the collimated beam which emerges from the waveguide. A device incorporating the apparatus of FIG. 1 is considered to be an article within the scope of this invention and the waveguides themselves are considered to be articles within the scope of this invention.

As described in U.S. Pat. No. 4,740,265 and U.S. Pat. No. 4,766,954, the use of substrate masking allows replacement of cations of one optically smooth surface by ions selected from at least one of Rb+ and Cs+ and Tl+ and a resulting change in the surface index of refraction with respect to the index at refraction of the starting substrate. In accordance with the instant invention, areas along the portion of the crystal substrate surface used for forming the desired channel may be alternately masked and unmasked during cation replacement so that the resulting channel consists of a series of aligned sections which alternate between original substrate (e.g., KTiOPO$_4$) and substrate material in which cat ions have been replaced, (e.g., K$_{1-x}$Rb$_x$TiOPO$_4$ where x is not zero). Standard photolithographic techniques may be used to provide the desired masking. For example, a mask of protective material (e.g., Ti) may be applied over the surface of the crystal substrate with a pattern generated therein to allow, upon suitable exposure to a molten salt, formation of sections of a second optical material by cation exchange. After cation replacement the remaining protective material may be removed.

One process for preparing a channel waveguide for a wavelength conversion system in accordance with this invention comprises the steps of: (1) providing the z-cut surface of a z-cut substrate of single crystal material having the formula K$_{1-x}$Rb$_x$TiOMO$_4$ wherein x is from 0 to 1 and M is P or As with an optically smooth surface; (2) providing a molten salt containing cations selected from the group consisting of Rb+, Cs+ and Tl+ in an amount effective to provide upon exposure to said optically smooth surface at a selected temperature for a selected time sufficient cation replacement to change the index of refraction with respect to the index of refraction of said substrate; (3) applying a masking material on said substrate to provide a pattern of aligned areas along a portion of said optically smooth surface which are alternately masked with a material resistant to said molten salt and unmasked; (4) immersing said masked substrate in said molten salt at said selected temperature for said selected time, thereby providing cation replacement in said unmasked areas; (5) removing the masking material from said substrate; and (6) finishing said substrate to provide a clean waveguide with polished waveguide input and output faces. In this process the length of said masked and unmasked areas is selected such that after said cation replacement in the unmasked areas, a channel waveguide is provided at said portion which comprises a series of aligned sections of optical materials having a periodic structure suitable to provide wavelength conversion for incident waves at a selected wavelength and a Bragg reflection for said selected wavelength which has a wavelength essentially equal to the wavelength of said incident waves. For balanced phase matching the sum for the series of sections of the product of the length of each section and the $\Delta k$ for that section is equal to about zero, and the length of each section is less than its coherence length; wherein the $\Delta k$ for each section is the difference between the sum of the propagation constants for the incident waves for the wavelength conversion system in that section and the sum of the propagation constant for the generated waves for said wavelength conversion system in that section, and the coherence length for each section is $$\frac{2\pi}{\Delta k}$$

for that section. For waveguides to be used for quasi-phase matching, the molten salt should also contains cations selected from the group consisting of Ba++, Sr++ and Ca++ and when x is greater than 0.8, cations selected from Tl+ and Cs+, and the molten salt contains said cations in an amount effective to provide upon exposure to said optically smooth surface at said selected time and temperature a nonlinear optical coefficient which is changed with respect to the nonlinear optical coefficient of the substrate. For quasi-phase matching the sum for the series of sections of the product of the length of each section and the $\Delta k$ for that section is equal to about $2\pi M_w$ where $M_w$ is an integer other than zero; wherein the $\Delta k$ for each section is the difference between the sum of the propagation constants for the incident waves for the wavelength conversion system in that section and the sum of the propagation constant for the generated waves for said wavelength conversion system in that section. Thallium containing substrates (i.e., substrates of the formula $K_{1-x}Rb_xTiOMO_4$ wherein the cations of said formula have been partially replaced by Tl+) are also considered suitable. KTiOPO$_4$ (i.e., x is zero and M is P) is a preferred substrate.

KTP substrates may be provided in accordance with step (1) by cutting and polishing a 1 mm thick z-cut substrate (i.e., to provide a single crystal with an optically smooth surface). A masking of Ti may be provided in accordance with step (3) in conformance with standard photolithographic techniques by sequentially applying Ti on the substrate; applying a photoresist material over the Ti and curing the photoresist; providing a photomask having the desired pattern and contact exposing the photoresist through the photomask; removing the exposed portion of the photoresist; and etching away the Ti beneath the removed photoresist; and removing the unexposed photoresist, so that the patterned Ti masking remains. Typically, the substrate will be end polished before it is immersed in the molten salt; and washed after removal of the salt. Typically the substrate is finished in accordance with step (6) by polishing it. After the Ti mask is removed, the waveguide may be suitably mounted so that a laser beam may be directed therein.

It should be recognized that the $\Delta k$ for each section in which cations have been exchanged in accordance with this process for waveguide preparation can be varied somewhat by changing the section width and/or depth, and may also vary somewhat as a function of replacement ion type and concentration. Accordingly, one may wish to prepare a number of waveguides having various widths, etc. to determine optimum design for a particular wavelength conversion system using particular materials.

Practice of the invention will become further apparent from the following non-limiting Examples.

EXAMPLES

COMPARATIVE EXAMPLE A

An end-polished KTiOPO$_4$ segmented waveguide consisting of a flux grown crystal of KTiOPO$_4$ containing a series of aligned optical conversion segments, each of which consist of a section of Rb/Tl/Ba-exchanged KTiOPO$_4$ and an adjacent section of KTiOPO$_4$ is prepared as follows: A flux grown crystal of KTiOPO$_4$ is first cut into approximately 1 mm thick z-plates. The z-surface is polished and coated with about 1000 Å of Ti by thermal evaporation. A photoresist is then contact exposed through a photomask having a waveguide pattern. The waveguide pattern consists of rectangular sections 4 micrometers in width with spacers of 2 micrometers. The exposed photoresist is removed and the Ti coating revealed beneath the removed photoresist is chemically etched using a solution of ethylene diamine tetraacetic acid (EDTA), H$_2$O$_2$ and NH$_4$OH so that the KTiOPO$_4$ substrate is selectively revealed. The remaining photoresist is removed and the Ti-masked substrate is end polished. The Ti-masked substrate is polished to give a total guide length of 5 mm and ion exchanged in a molten salt bath consisting of 1 mole % BaNO$_3$, 4 mole % TlNO$_3$ and 95 mole % RbNO$_3$, at a temperature of 360° C. for an exchange time of 1 hour. After the exchange time elapses, the substrate is cooled to room temperature and the Ti mask is removed.

The resulting waveguide consists of a repeating pattern of groups of optical conversion segments, each of which segments consist of two sections. One of these sections is ion-exchanged with Rb/Tl/Ba and the other section is bulk KTiOPO$_4$, i.e., substrate which is not ion exchanged. The ion-exchanged sections, or "guiding sections", are of two length types: Type A is 2.1 microns in length and length Type B is 2.0 microns in length. These ion-exchanged sections were separated by a 2 micron long section, Type C, of bulk KTiOPO$_4$, i.e., non-guiding section. The repeating pattern of groups of optical conversion segments according to type of section is ACACBCACACBCACBCACACBCACBCACACBC.

The superperiod of this waveguide consists of the 32 sections, ACACBCACACBCACBCACACBCACBCACACBC, where the length of the sections A, B, and C are 2.1, 2.0, and 2.0 $\mu$, respectively. The A and B sections have higher index than the C sections. The calculated reflectivity for the Bragg reflection of $282^{nd}$ order from one superperiod is shown by the dotted line in FIG. 5 as a function of the line width parameter $\delta$. For purposes of calculation, the indices of the high-index sections are 1.8496, while the indices of the low-index sections are 1.8346. The as-designed waveguide has its high index sections decreased by $\delta$, while each low-index section is increased by $\delta$. There is a cyclic pattern of Bragg reflection intensity with line width deviation $\delta$, and a change in the line width of 0.11 $\mu$ is sufficient to change from maximum to zero intensity.

EXAMPLE 1

This example illustrates the redesign of the waveguide of Comparative Example A using the method of this invention. A waveguide consisting of q=7 segments with superperiod $\Lambda=28.4$ $\mu$ has an average segment length $\Lambda/q=4.057$ $\mu$. This is sufficiently close to the value of 4.063 from Comparative Example A that the wavelength for quasi-phase matching in KTP will be quite similar, only some 0.3 nm shorter than Comparative Example A. For Comparative Example A, $2\Lambda/N_z=0.4610$ $\mu$, while if we chose order $N_z=123$ and superperiod $\Lambda=28.4$ $\mu$ we have $2\Lambda/N_z=0.4618$, so that the wavelength of Bragg reflection $\lambda_{Bragg}$ here will be still be close enough to $\lambda_{QPM}$ to bring the two into coincidence by temperature tuning the KTP. In keeping with Comparative Example A, we assume a limitation of 0.1 μ increments on the possible dimensions used. Then we can consider the optical path length for possible segment lengths $A_i$ in Table I. The segment lengths shown deviate by no more than about 13% from the average segment length.

TABLE I

| $A_i (\mu)$ | $A_i N_z / 2\Lambda$ |
|---|---|
| 3.6 | 7.80 |
| 3.7 | 8.01 |
| 3.8 | 8.23 |
| 3.9 | 8.45 |
| 4.0 | 8.66 |
| 4.1 | 8.88 |
| 4.2 | 9.10 |
| 4.3 | 9.31 |
| 4.4 | 9.53 |
| 4.5 | 9.74 |
| 4.6 | 9.96 |

In this case we desire the maximum magnitude of $\Sigma a_i$, and for this segment lengths Ai near half wave length will tend to be desirable. For minimizing $\Sigma \beta_i$ (or $\Sigma \alpha_i$), and if we consider only two interfaces at a time, then lengths $B_i$ near odd quarter wave will tend to be desirable. Due to the large number of possibilities and the fact that perfect half-wave or quarter-wave lengths are not provided by the 0.1 μ dimension increments, a computer program was written to select the segment lengths, with the results in Table II. After selecting the A and B interfaces, the two sets are overlaid with an offset which will give near the desired average high-index fraction, which is $(\Sigma h_{2i-1})/\Lambda$.

TABLE II

| i | 1 | 2 | 3 | 4 | 5 | 6 | 7 |
|---|---|---|---|---|---|---|---|
| $A_i$ | 3.9 | 4.4 | 3.7 | 4.6 | 3.7 | 3.7 | 4.4 |
| $B_i$ | 4.5 | 3.8 | 4.0 | 4.0 | 3.8 | 4.5 | 3.8 |
| $h_{2i-1}$ | 1.9 | 2.5 | 1.9 | 2.2 | 1.6 | 1.7 | 2.5 |
| $h_{2i}$ | 2.0 | 1.9 | 1.8 | 2.4 | 2.1 | 2.0 | 1.9 |

Figure 5:
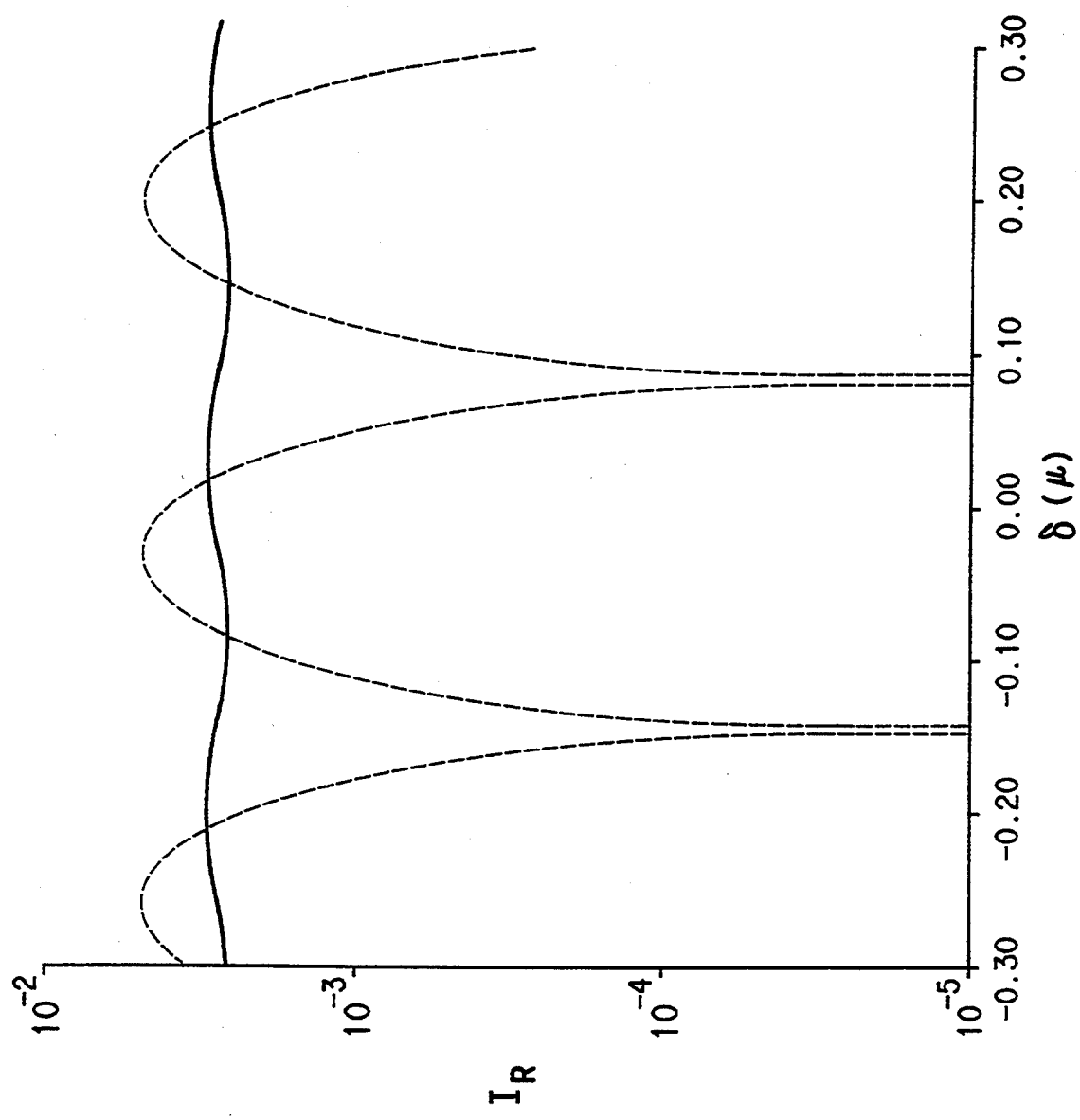
FIG. 5 is a graph of the relative intensity of reflectivity ($I_R$) versus the line width parameter $\delta$.

The calculated reflectivity of this reflector as a function of line width variation is shown as the solid line in FIG. 5. It can be seen that there is much less variation of the intensity than in the original design Comparative Example A.

EXAMPLE 2

This example illustrates making a second harmonic generator by quasi-phase matching in $KTiOPO_4$, which also has a Bragg peak for locking a diode laser. In order to have finer control over the pitch, a 10X reticle is written at 0.1 μ addressing increments, and this pattern is projected through a 10:1 reduction lens to produce a final 1X photomask. Thus each 0.1 μ increment in the reticle corresponds to 0.01 μ change on the 1X photomask. The number of segments q is set at 4, while the superperiod is set at 15.89 μ. In the intended use, the pump diode laser is locked to the wavelength of the $68^{th}$ order Bragg reflection, and this Bragg wavelength is brought into coincidence with the quasi-phase matching peak by temperature tuning the KTP. In this case it is desired to suppress the reflection intensity of adjacent Bragg orders ($N_z = 68$ or 70), so that there is only one Bragg reflection of appreciable intensity at any wavelength where the diode laser has sufficient gain to oscillate. The width of the waveguide is 4 μ, while the dimensions of the superperiod along the propagation direction are selected as follows:

| i | 1 | 2 | 3 | 4 |
|---|---|---|---|---|
| $A_i$ | 3.77 | 4.06 | 3.99 | 4.07 |
| $B_i$ | 4.03 | 4.03 | 4.03 | 3.80 |
| $h_{2i-1}$ | 1.99 | 2.25 | 2.22 | 2.26 |
| $h_{2i}$ | 1.78 | 1.81 | 1.77 | 1.81 |

The A interfaces have a calculated reflected field amplitude at $69^{th}$ order of about 43% of the maximum amplitude obtainable by perfect half-wave positioning of four interfaces, and approximately 5% of maximum for the $68^{th}$ and $70^{th}$ orders. The B interfaces have less than 2% of the maximum obtainable field amplitude for all three orders.

An end-polished $KTiOPO_4$ segmented waveguide consisting of a flux grown crystal of $KTiOPO_4$ containing a series of aligned optical conversion segments, each of which consist of a section of Rb/Ba-exchanged $KTiOPO_4$ and an adjacent section of $KTiOPO_4$ is prepared as follows: A flux grown crystal of $KTiOPO_4$ is first cut into approximately 1 mm thick z-plates. The z-surface is polished and coated with photoresist. A contact exposure is made through the mask described above, and the exposed areas of photoresist removed. About 400 Å of titanium is deposited by thermal evaporation. The Ti coated on top of the remaining photoresist is lifted off by soaking the crystal in acetone. The result is approximately 2×4 μ rectangular openings in the Ti mask. The Ti-masked substrate is end polished to give a total guide length of 6 mm and ion exchanged in a molten salt bath consisting of 8 mole % $Ba(NO_3)_2$, 92 mole % $RbNO_3$, at a temperature of 320° C. for an exchange time of 28 minutes. After the exchange time elapses, the substrate is cooled to room temperature and the Ti mask is removed. The resulting waveguide consists of a repeating pattern of groups of optical conversion segments, each of which segments consist of two sections. One of these sections is ion-exchanged with Rb/Ba and the other section was bulk $KTiOPO_4$, i.e., substrate which is not ion exchanged.

Figure 6:
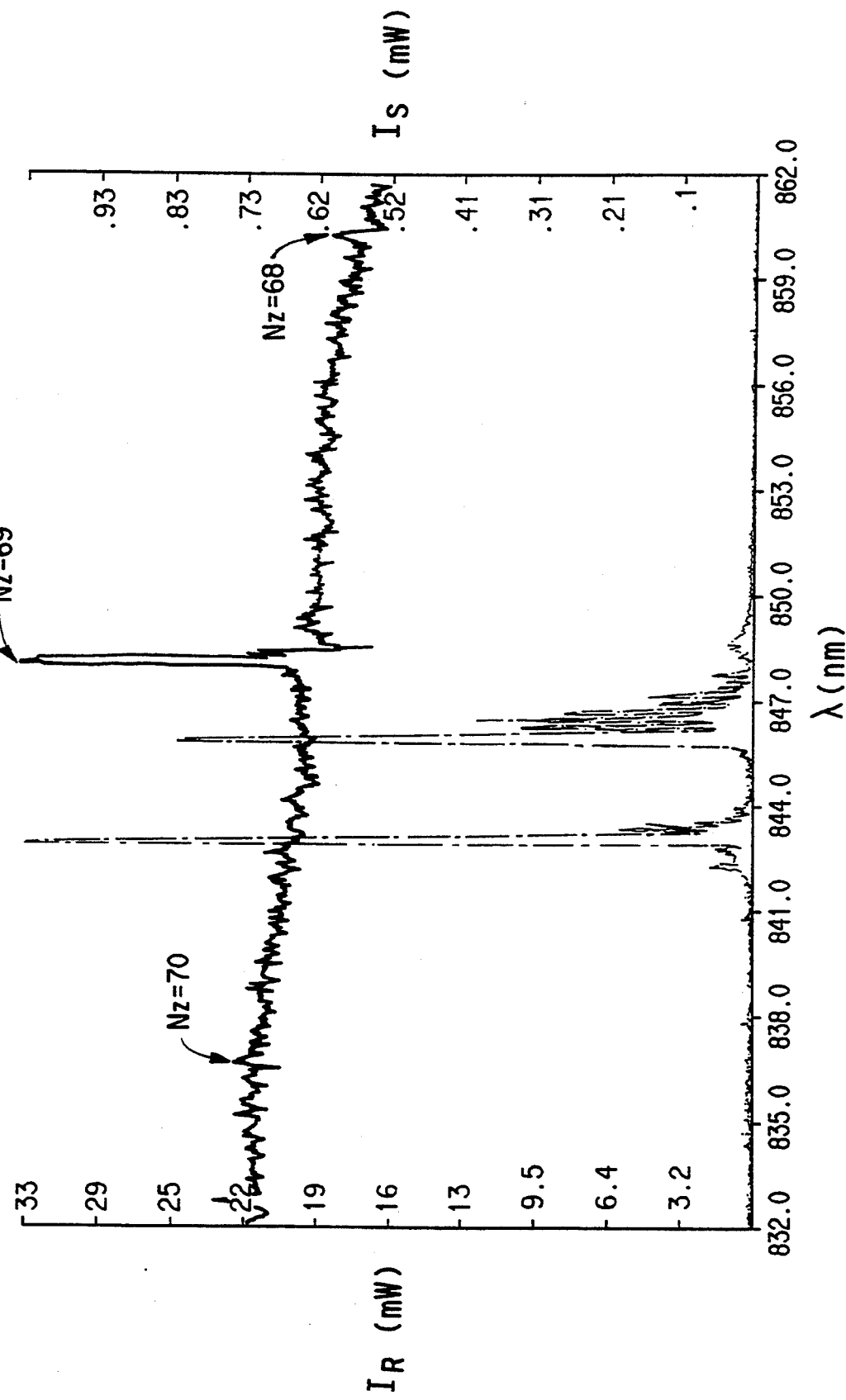
FIG. 6 is a graph of the reflected fundamental intensity ($I_R$) shown by the solid trace and second harmonic intensity ($I_s$) shown by the broken trace, versus the input wavelength $\lambda$.

The performance of the Bragg reflector is measured by end-fire coupling light from a $Ti:Al_2O_3$ laser into the waveguide. The solid trace of FIG. 6 shows the reflected light as a function of wavelength. At all wavelengths there is some light reflected from the interfaces between the KTP and the air. (The end faces were not anti-reflection coated.) The Bragg peaks appear against this background, and the 68, 69, and $70^{th}$ orders are indicated on the Figure. It can be seen that the adjacent orders have been reduced over the central order. The intensity of reflected light at the $69^{th}$ order peak corresponds to about 29% of the light coupled into the waveguide being reflected back towards the laser. This allows sufficient light to continue down the waveguide for SHG purposes. The dotted trace of FIG. 6 shows the intensity of second harmonic radiation. In use with a diode laser, the KTP would be heated some 26° C. to bring the SHG peak (846.1 nm in FIG. 6) into coincidence with the Bragg peak.

Particular embodiments of the invention are included in the examples. Other embodiments will become apparent to those skilled in the art from a consideration of the specification or practice of the invention disclosed herein. It is understood that modifications and variations may be practiced without departing from the spirit and scope of the novel concepts of this invention. It is further understood that the invention is not confined to the particular formulations and examples herein illustrated, but it embraces such modified forms thereof as come within the scope of the claims.

What is claimed is:

1. A segmented article which is suitable for use with an input wave of selected wavelength and has selected Bragg reflection characteristics for said input wavelength, said article comprising alternating sections of optical materials which are aligned and have refractive indexes different from adjacent sections to form at least one superperiod consisting of a plurality of segments such that each segment consists of a section of a first optical material and a section of a second optical material, wherein at least one segment of the superperiod is different in optical path from another segment thereof, and wherein the interfaces between sections of the superperiod create backward traveling waves of complex amplitude at said input wavelength, with the first, third, and any other sequentially odd interfaces in the superperiod forming a first set of superperiod interfaces and the second, fourth, and any other sequentially even interfaces in the superperiod forming a second set of superperiod interfaces, and said article characterized by:

(1) the sum for the superperiod sections of the product of the length of each section in the direction of alignment and said refractive index of the section being equal to about $N_z\lambda/2$ where $N_z$ is an integer and $\lambda$ is the wavelength of said input wave; and (2) the interfaces of one of said two sets of interfaces in the superperiod being spaced such that the modulus of the sum of the complex amplitudes created by that set is about zero.

2. A segmented article which is suitable for use with an input wave of selected wavelength and has selected Bragg reflection characteristics for said input wavelength, said article comprising alternating sections of optical materials which are aligned and have refractive indexes different from adjacent sections to form at least one superperiod consisting of a plurality of segments such that each segment consists of a section of a first optical material and a section of a second optical material wherein at least one segment of the superperiod is different in optical path from another segment thereof and wherein the interfaces between sections of the superperiod create backward traveling waves of complex amplitude at said input wavelength, with the first, third, and any other sequentially odd interfaces in the superperiod forming a first set of superperiod interfaces and the second, fourth, and any other sequentially even interfaces in the superperiod forming a second set of superperiod interfaces, and said article characterized by:

(1) the sum for the superperiod sections of the product of the length of each section in the direction of alignment and said refractive index of the section being equal to about $N_z\lambda/2$ where $N_z$ is an integer and $\lambda$, is the wavelength of said input wave; and (2) the interfaces of one of said two sets of interfaces in the superperiod are spaced such that the modulus of the sum of the complex amplitudes created by that set is less than 40 percent of the modulus of the sum of the complex amplitudes created by the other set.

3. The segmented article of claim 1 or claim 2 which is a waveguide Bragg reflector.

4. The segmented article of claim 3 having alternating sections of $KTiOPO_4$ and $KTiOPO_4$ wherein the cations have been partially replaced by $Ba^{++}$, and at least one of $Tl^+$ and $Rb^+$.

5. A segmented article of claim 3 suitable for use as a waveguide for wavelength conversion at a selected wavelength, characterized by having a periodic structure along the waveguide which provides a Bragg reflection for said selected wavelength which has a wavelength essentially equal to the wavelength of the input wave used for wavelength conversion.

6. The segmented article of claim 5 having alternating sections of $KTiOPO_4$ and $KTiOPO_4$ wherein the cations have been partially replaced by $Ba^{++}$, and at least one of $Tl^+$ and $Rb^+$.

7. The segmented article of claim 1 or claim 2 wherein said alternating sections are alternating sections of crystalline substrate having the formula $K_{1-x}Rb_xTiOMO_4$ where x is from 0 to 1 and M is P or As, and sections of substrate material in which cations of said substrate have been partially replaced.

8. A device comprising:
(a) A segmented article which is suitable for use with an input wave of selected wavelength and has selected Bragg reflection characteristics for said input wavelength, said article comprising alternating sections of optical materials which are aligned and have refractive indexes different from adjacent sections to form at least one superperiod consisting of a plurality of segments such that each segment consists of a section of a first optical material and a section of a second optical material, wherein at least one segment of the superperiod is different in optical path from another segment thereof, and wherein the interfaces between sections of the superperiod create backward traveling waves of complex amplitude at said input wavelength, with the first, third, and any other sequentially odd interfaces in the superperiod forming a first set of superperiod interfaces and the second, fourth, and any other sequentially even interfaces in the superperiod forming a second set of superperiod interfaces, and said article characterized by:
(1) the sum for the superperiod sections of the product of the length of each section in the direction of alignment and said refractive index of the section being equal to about $N_z\lambda/2$ where $N_z$ is an integer and $\lambda$ is the wavelength of said input wave; and
(2) the interfaces of one of said two sets of interfaces in the superperiod being spaced such that the modulus of the sum of the complex amplitudes. Created by that set is about zero:
(b) a laser source; and
(c) means to couple an incoming optical wave into said segmented article.

9. A device comprising:
(a) A segmented article which is suitable for use with an input wave of selected wavelength and has selected Bragg reflection characteristics for said input wavelength, said article comprising alternating sections of optical materials which are aligned and have refractive indexes different from adjacent sections to form at least one superperiod consisting of a plurality of segments such that each segment consists of a section of a first optical material and a section of a second optical material, wherein at least one segment of the superperiod is different in optical path from another segment thereof, and wherein the interfaces between sections of the superperiod create backward traveling waves of complex amplitude at said input wavelength, with the first, third, and any other sequentially odd interfaces in the superperiod forming a first set of superperiod interfaces and the second, fourth, and any other sequentially even interfaces in the superperiod forming a second set of superperiod interfaces, and said article characterized by:

(1) the sum for the superperiod sections of the product of the length of each section in the direction of alignment and said refractive index of the section being equal to about $N_z\lambda/2$ where $N_z$ is an integer and $\lambda$ is the wavelength of said input wave; and (2) the interfaces of one of said two sets of interfaces in the superperiod are spaced such that the modulus of the sum of the complex amplitudes created by that set is less than 40 percent of the modulus of the sum of the complex amplitudes created by the other set;

(b) a laser source; and (c) means to direct Bragg reflection to the laser source of the input wave and to couple an incoming optical wave into said segmented article.

10. The device of claim 8 or 9 wherein the segmented article is a waveguide.

11. The device of claim 10 wherein the waveguide is suitable for wavelength conversion.

* * * * *